United States Patent [19]
Rath et al.

[11] Patent Number: 6,033,996
[45] Date of Patent: Mar. 7, 2000

[54] PROCESS FOR REMOVING ETCHING RESIDUES, ETCHING MASK AND SILICON NITRIDE AND/OR SILICON DIOXIDE

[75] Inventors: David L. Rath, Stormville, N.Y.; Rangarajan Jagannathan, South Burlington, Vt.; Kenneth J. McCullough, Fishkill, N.Y.; Harald F. Okorn-Schmidt, Putnam Valley, N.Y.; Karen P. Madden, Poughquag, N.Y.; Keith R. Pope, Danbury, Conn.

[73] Assignee: International Business Machines Corporation, Armonk, N.Y.

[21] Appl. No.: 08/969,595

[22] Filed: Nov. 13, 1997

[51] Int. Cl.[7] .................................................. H01L 21/302
[52] U.S. Cl. .......................... 438/756; 438/757; 438/906; 438/963; 216/99; 252/79.3; 252/79.4; 134/1.3; 134/902
[58] Field of Search ..................................... 438/696, 738, 438/745, 753, 906, 963, 756, 757; 252/79.3, 79.4; 216/99; 134/1.3, 902

[56] References Cited

U.S. PATENT DOCUMENTS

| | | | |
|---|---|---|---|
| 3,676,240 | 7/1972 | Retajczyk | 156/17 |
| 3,979,241 | 9/1976 | Maeda et al. | 156/13 |
| 4,230,523 | 10/1980 | Gagda | 156/657 |
| 4,267,013 | 5/1981 | Iida et al. | 156/643 |
| 4,269,654 | 5/1981 | Deckert et al. | 156/657 |
| 4,285,763 | 8/1981 | Coldren | 156/643 |
| 4,325,984 | 4/1982 | Galfo et al. | 427/38 |
| 4,334,349 | 6/1982 | Aoyama et al. | 29/579 |
| 4,351,696 | 9/1982 | Radigan | 156/643 |
| 4,395,304 | 7/1983 | Kern et al. | 156/657 |
| 4,444,618 | 4/1984 | Saia et al. | 156/643 |
| 4,472,237 | 9/1984 | Deslauriers et al. | 156/643 |
| 4,547,260 | 10/1985 | Takada et al. | 156/643 |
| 4,692,205 | 9/1987 | Sachdev et al. | 156/643 |
| 4,899,767 | 2/1990 | McConnell et al. | 134/56 R |
| 4,962,049 | 10/1990 | Chang et al. | 437/13 |
| 4,971,715 | 11/1990 | Armant et al. | 252/143 |
| 4,985,113 | 1/1991 | Fujimoto et al. | 156/643 |
| 4,985,990 | 1/1991 | Cronin et al. | 29/852 |
| 4,987,101 | 1/1991 | Kaanta et al. | 437/228 |
| 5,012,692 | 5/1991 | Nagano | 74/475 |
| 5,037,506 | 8/1991 | Gupta et al. | 156/646 |
| 5,082,518 | 1/1992 | Molinaro | 156/345 |
| 5,139,624 | 8/1992 | Searson et al. | 204/129.3 |
| 5,217,570 | 6/1993 | Kadomura | 156/665 |
| 5,308,440 | 5/1994 | Chino et al. | 156/664 |
| 5,334,332 | 8/1994 | Lee | 252/548 |
| 5,338,416 | 8/1994 | Mlcak et al. | 204/129.3 |
| 5,348,619 | 9/1994 | Bohannon et al. | 156/664 |
| 5,348,627 | 9/1994 | Propst et al. | 204/129.3 |
| 5,350,488 | 9/1994 | Webb | 156/643 |
| 5,387,361 | 2/1995 | Kohara et al. | 252/79.1 |
| 5,407,860 | 4/1995 | Stoltz et al. | 437/180 |
| 5,419,779 | 5/1995 | Ward | 134/38 |
| 5,431,766 | 7/1995 | Propst et al. | 156/345 |
| 5,461,003 | 10/1995 | Havemann et al. | 437/187 |
| 5,468,342 | 11/1995 | Nulty et al. | 156/643.1 |
| 5,475,267 | 12/1995 | Ishii et al. | 257/752 |
| 5,533,635 | 7/1996 | Man | 216/67 |
| 5,544,776 | 8/1996 | Okuda et al. | 216/83 |
| 5,556,482 | 9/1996 | Ward et al. | 134/38 |
| 5,571,447 | 11/1996 | Ward et al. | 510/206 |
| 5,591,299 | 1/1997 | Seaton et al. | 156/626.1 |
| 5,650,041 | 7/1997 | Gotoh et al. | 156/653.1 |
| 5,698,503 | 12/1997 | Ward et al. | 510/176 |
| 5,709,756 | 1/1998 | Ward et al. | 134/1.3 |
| 5,780,363 | 7/1998 | Delehanty et al. | 438/748 |

FOREIGN PATENT DOCUMENTS

| | | | |
|---|---|---|---|
| WO 97/02958 | 1/1997 | European Pat. Off. | B44C 1/22 |
| 58-143532 | 8/1983 | Japan | H01L 21/30 |

OTHER PUBLICATIONS

El–Kareh, B., *Fundamentals of Semiconductor Processing Technologies,* Kluwer Academic Publishers, Norwell, MA, 1995: 565–571.

Anon, Flush Fluids for Ink Jet Ink Devices, *Research Disclosure,* Jan. 1991, No. 321.

"Etching $SiO_2$ Films In Aqueous 0.49% HF", Somashekhar et al, *J. Electrochem. Soc.,* vol. 143, No. 9, pp. 2885–2891, Sep. 1996.

*Primary Examiner*—William Krynski
*Assistant Examiner*—Michael E. Goendzynski
*Attorney, Agent, or Firm*—Pollock, Vande Sande & Amernick; Jay H. Anderson

[57] ABSTRACT

Etching residue, etching mask and silicon nitride and/or silicon dioxide are etched or removed employing a composition containing a fluoride containing compound, water and certain organic solvents.

23 Claims, No Drawings

PROCESS FOR REMOVING ETCHING RESIDUES, ETCHING MASK AND SILICON NITRIDE AND/OR SILICON DIOXIDE

TECHNICAL FIELD

The present invention is concerned with a process for removing etching residues, etching mask and silicon nitride and/or silicon dioxide that requires only a single composition. Moreover, the process of the present invention can be used to simultaneously remove etching residues, etching mask and silicon nitride and/or silicon dioxide.

BACKGROUND OF INVENTION

In the fabrication of microelectronic components, a number of the steps involved, for instance, in preparing integrated circuit chips and the packaging for the chips (articles to which the chips are attached and protected), are etching processes. Accordingly, over the years, a number of vastly different types of etching processes to remove material, sometimes in selective areas, have been developed and are utilized to varying degrees. Moreover, the steps of etching different layers which constitute, for instance, the finished integrated circuit chip are among the most critical and crucial steps.

One method widely employed for etching is to overlay the surface to be etched with a suitable mask and then immerse the surface and mask in a chemical solution which attacks the surface to be etched, while leaving the mask intact and while only etching other materials of the article to at most, a minimum extent. These techniques are commonly referred to as wet etching.

Increasingly, reactive ion etching (RIE), plasma etching and ion milling are being used to define the pattern in a substrate and to form trenches which expose the semiconductor substrate such as silicon. The RIE process leaves residues on the semiconductor in the trenches of a complex mixture that may include re-sputtered oxide material and possibly small amounts of organic material from the resists used to delineate the trenches, including deep trenches.

Accordingly, these residues must be removed without adversely affecting those materials which are to remain as part of the article.

Furthermore, etching processes such as reactive ion etching (RIE), plasma etching and ion milling are typically carried out employing as mask materials a silicate glass, silicate esters such as tetraethylorthosilicide and silicon oxynitride. After the etching procedure, the remaining mask materials are also removed and must be done without adversely affecting those materials which are to remain as part of the article.

Furthermore, in many devices it is desirable to remove selected portions of silicon nitride layers and/or silicon dioxide layers such as in forming recesses again without adversely affecting those materials which are to remain as part of the article. In many such structures, a silicon nitride layer exists on top or beneath a silicon dioxide layer and it becomes necessary to etch the silicon nitride without overetching the silicon dioxide. The ability to use an aqueous fluoride solution such as aqueous hydrogen fluoride in such situation presents a problem since aqueous hydrogen fluoride etches silicon dioxide at a much faster rate than it does silicon nitride.

In order to remove the etching residues, etching mask material and selected portions of silicon nitride and/or silicon dioxide, it has been necessary to use at least three different processing compositions and steps typically employing deionized water rinse and drying steps between each step. For instance, reactive ion etching residues have been removed using BHF; and etching mask using certain HF-sulfuric acid compositions. Etching recesses in silicon nitride/silicon dioxide has been accomplished with certain compositions of HF and glycerol.

It would therefore be desirable to provide an etching procedure that achieves excellent removal of the above materials without adversely affecting those other materials which are to remain as part of the article, at least during subsequent processing, and without the need to employ a plurality of different compositions and processing steps.

SUMMARY OF INVENTION

It has been found according to the present invention that certain fluoride containing compositions can be used to remove etching residues, etching mask and silicon nitride and/or silicon dioxide without adversely affecting to an undesired extent those materials which are to remain as part of the article or at least during subsequent processing. Moreover, it has been found that the rate at which the above diverse materials are removed by the fluoride containing compositions makes it possible to provide a process that can treat all of the above materials in the same bath and at the same time as contrasted to using multiple steps.

More particularly, the present invention relates to a method for removing etching residues, removing an etching mask and for etching at least one of silicon nitride and/or silicon dioxide, using a single composition which comprises contacting an article containing said residues, etching mask and at least one of silicon nitride and silicon dioxide with a composition containing about 0.05 to about 3 molar of a fluoride containing compound, about 0.05 to about 4 molar of water; and an organic solvent selected from the group consisting of oxalanes, sulfolanes, esters, ketanes, aldehydes, lactanes, halogenated hydrocarbons, alcohols, amines and imides to thereby remove said etching residues, said etching masks and at least portions of the silicon nitride and/or silicon dioxide.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

One of the groups of materials selectively removed by the process of the present invention are etching residues and especially residues caused by forming trenches including deep trenches by reactive ion etching. The residues removed according to the present invention are preferably that which have been created by reactive ion etching of trenches.

The present invention further removes etching mask material such as silicate glass, silicate esters such as tetraethylorthosilicate and silicon oxynitride and preferably silicate glass. The silicate glass is preferably unannealed silicate glass that has been doped with boron, arsenic, antimony and/or phosphorous. The doped silicate glass to be removed according to the present invention typically contains about 0.5 to about 10 percent by weight and preferably about 3 to about 7 percent by weight of the dopant.

The present invention also removes silicon nitride and/or silicon dioxide. For instance, the invention finds especial applicability in forming recesses in silicon nitride/silicon dioxide layer structures present in the article being treated. The silicon dioxide is preferably high density silicon dioxide. High density silicon dioxide refers to thermally grown silicon dioxide or silicon dioxide that is chemically vapor deposited (CVD) or physically vapor deposited (PVD) followed by thermal annealing.

Also important to the present invention are the relative etch or removal rates achieved for the different materials. In particular, the etching residues are located in trenches where the semiconductor such as silicon is exposed. Accordingly, the etch rate for removing the residues should be at least about 100 times, preferably at least about 250 times and most preferably at least about 500 times the rate for the silicon, silicide and interlevel dielectric material.

The etch rate for the etch masks especially when it is a silicate is typically at least about 100 times that for silicon dioxide. The etch rate for silicon nitride is typically at least as fast as the rate for silicon dioxide and preferably at a rate greater than that for silicon dioxide and most preferably at a rate at least about 10 percent greater.

The etching compositions employed pursuant to the present invention contain a compound containing fluoride and an organic solvent. The amount of the fluoride containing compound in the composition is about 0.05 to about 3 molar, and preferably about 0.2 to about 2.5 molar, and most preferably about 0.25 to about 1.5 molar.

Typical compounds providing a fluoride source according to the present invention are hydrofluoric acid, ammonium fluoride, fluoroborates, fluoroboric acid, tin bifluoride, antimony fluoride, tetrabutylammonium tetrafluoroborate, and aluminum hexafluoride. Also, a fluoride salt of an aliphatic primary, secondary or tertiary amine can be used. Such have the following formula:

$R_1N(R_3)R_2$ wherein $R_1$, $R_2$ and $R_3$ each individually represent H or an alkyl group. Typically, the total number of carbon atoms in the $R_1$, $R_2$ and $R_3$ groups is 12 carbon atoms or less. The preferred fluoride compounds are hydrogen fluoride and ammonium fluoride.

The hydrogen fluoride is typically employed as a 49 weight percent aqueous solution.

Examples of suitable organic compounds include oxolanes, sulfolanes, esters, ketones, aldehydes, lactones, halogenated solvents, amines, imides and alcohols. The preferred alcohols are monohydric alcohols. Examples of suitable esters are esters of carbonic acids, benzoic acid, phthalic acid, isophthalic acid and terephthalic acid, and especially the $C_1-C_6$ alkyl esters. Preferred organic solvents are propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, and methyl and ethyl esters of phthalic, isophthalic or terephthalic acids. The more preferred solvents employed pursuant to the present invention are propylene carbonate, N-methylpyrrolidone and gamma butyrolactone, with propylene carbonate being the most preferred.

The compositions employed in the present invention also include water. Typically, when present, the water is employed in an amount of about 0.05 to about 4.0 molar, preferably about 0.2 to about 2.9 molar, and most preferably about 0.25 to about 1.7 molar.

The etching process of the present invention is typically carried out at temperatures of about 20° C. to about 90° C., and preferably about 30° C. to about 75° C. Employing increased temperature results in increasing the etch rates of the silicate, the silicon nitride and the silicon dioxide. The increase in the etch rate due to increased temperature will be somewhat greater for the silicate glass than for the silicon dioxide, thereby somewhat increasing the selectivity of the etching of the silicate glass. Moreover, employing increased temperature results in increasing the removal rates of the residues but not necessarily the rates for the silicon, thereby increasing the selectivity of removing the residues. Also, as the fluoride concentration increases, it becomes necessary to also increase the temperature in order to achieve the desired etching rate of the silicon nitride in comparison to that for the silicon dioxide.

The following non-limiting examples are presented to further illustrate the present invention.

EXAMPLE 1

An etching composition is prepared by admixing one part by volume of a 49 percent by weight aqueous solution of HF with about 115 parts by volume of propylene carbonate to provide a 0.25 molar HF solution in propylene carbonate. A patterned silicon wafer having a layer of thermally grown silicon dioxide beneath a layer of silicon nitride which in turn is beneath a layer of 6 weight percent boron doped silicate glass is contacted with this etching composition. The article includes trenches thereby exposing the walls of the trenches of the underlying layers, i.e. silicon nitride and silicon dioxide, to the etchant. Also exposed are the silicon in the trench and the etch residues on the sidewalls on top of the silicon. The etching is carried out at about 60° C. The etching solution etches the boron doped silicate glass at a rate of about 68 nanometers/minute, the silicon dioxide at a rate of about 0.22 nanometers per minute and the nitride at a rate of 0.45 nanometers/minute. This results in a selectivity of boron silicate glass etching relative to the silicon dioxide of about 300:1 and rate of the nitride to silicon dioxide of about 2:1.

EXAMPLE 2

Example 1 is repeated except that the etching composition is prepared by admixing one part by volume of a 49 percent by weight aqueous solution of HF with about 58 parts by volume of propylene carbonate to provide a 0.5 molar HF solution in propylene carbonate. The etching is carried out at about 70° C. The etching solution etches the boron doped silicate glass at a rate of about 390 nanometers per minute, the silicon dioxide at a rate of about 0.96 nanometers per minute and the silicon nitride at a rate of about 1.58 nanometers per minute. This results in a selectivity of boron silicate glass etching relative to the silicon dioxide of about 406:1 and rate of the nitride to silicon dioxide up to about 1.65:1.

EXAMPLE 3

Example 1 is repeated except that the etching composition is prepared by admixing one part by volume of a 49 percent by weight aqueous solution of HF with about 41 parts by volume of propylene carbonate to provide a 0.7 molar HF solution in propylene carbonate. The etching is carried out at 75° C. The etching solution etches the boron doped silicate glass at a rate of about 630 nanometers per minute, the silicon dioxide at a rate of about 2.2 nanometers per minute and the silicon nitride at a rate of about 3.0 nanometers per minute. This results in a selectivity of boron silicate glass etching relative to the silicon dioxide of about 280:1 and rate of the nitride to silicon dioxide of about 1.4:1.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for removing etching residues, removing etching mask and for etching at least one material selected from the group consisting of silicon nitride and high density silicon dioxide; using a single composition which comprises contacting an article containing said residues, etching mask and at least one of silicon nitride and silicon dioxide with a composition containing about 0.05 to about 3 molar of a fluoride containing compound; about 0.05 to about 4 molar of water; and an organic solvent selected from the group consisting of oxalanes, sulfolanes, esters, ketones, aldehydes, lactones, halogenated hydrocarbons, alcohols, amines and imides to thereby remove said residues, said etching mask and at least portions of the silicon nitride or silicon dioxide or both.

2. The method of claim 1 wherein said organic solvent is selected from the group consisting of propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, methyl and ethyl esters of acid selected from the group consisting of phthalic acid, isophthalic acid and terephthalic acid.

3. The method of claim 1 wherein said organic solvent is selected from the group consisting of propylene carbonate, N-methyl pyrrolidone and gamma butyrolactone.

4. The method of claim 1 wherein said solvent is propylene carbonate.

5. The method of claim 1 wherein said fluoride containing compound is selected from the group consisting of hydrofluoric acid, ammonium fluoride, fluoroborates, tetrabutylammonium tetrafluoroborate, fluoroboric acid, aluminum hexafluoride, tin biflouride, antimony fluoride and fluoride salt of an aliphatic primary, secondary or tertiary amine.

6. The method of claim 1 wherein said fluoride containing compound is hydrofluoric acid or ammonium fluoride.

7. The method of claim 1 wherein said fluoride containing compound is hydrofluoric acid.

8. The method of claim 1 wherein the amount of water is about 0.2 to about 2.9 molar.

9. The method of claim 1 wherein the amount of water is about 0.25 to about 1.7 molar.

10. The method of claim 1 wherein the amount of said fluoride is about 0.2 to about 2.5 molar.

11. The method of claim 1 wherein the amount of said fluoride is about 0.25 to about 1.5 molar.

12. The method of claim 1 wherein the contacting with said composition is carried out at a temperature of about 20° C. to about 90° C.

13. The method of claim 1 wherein the contacting with said composition is carried out at a temperature of about 30° C. to about 75° C.

14. The method of claim 1 wherein said residue is caused by an etching process selected from the group consisting of plasma etching, reactive ion etching and ion milling.

15. The method of claim 1 wherein said residue is caused by reactive ion etching.

16. The method of claim 1 wherein said etching mask is selected from the group consisting of silicate glass, silicate esters and silicon oxynitride.

17. The method of claim 1 wherein said etching mask is silicate glass.

18. The method of claim 17 wherein said silicate glass is a silicate glass doped with at least one member selected from the group consisting of boron, arsenic, antimony and phosphorous.

19. The method of claim 17 wherein said silicate glass is a boron doped glass.

20. The method of claim 1 wherein said silicon dioxide is selected from the group consisting of thermally grown silicon dioxide, chemically vapor deposited thermally annealed silicon dioxide and physically vapor deposited thermally annealed silicon dioxide.

21. The method of claim 1 wherein said silicon dioxide is thermally grown silicon dioxide.

22. The method of claim 1 wherein the alcohol is a monohydric alcohol.

23. A method for removing etching residues, removing etching mask selected from the group consisting of silicate glass, silicate esters and silicon oxynitride and for etching at least one material selected from the group consisting of silicon nitride and high density silicon dioxide selected from the group consisting of thermally grown silicon dioxide, chemically vapor deposited thermally annealed silicon dioxide and physically vapor deposited thermally annealed silicon dioxide, using a single composition which comprises contacting an article containing the etching residues, etching mask and at least one of the silicon nitride and high density silicon dioxide with a composition containing about 0.25 to about 1.5 molar of hydrofluoric acid, about 0.25 to about 1.7 molar of water, and propylene carbonate to thereby remove the etching residues, the etching mask and at least portions of the silicon nitride or high density silicon dioxide or both.

* * * * *